United States Patent [19]
Byrd et al.

[11] Patent Number: 6,064,329
[45] Date of Patent: May 16, 2000

[54] SYSTEM FOR CREATING AND AMPLIFYING THREE DIMENSIONAL SOUND EMPLOYING PHASE DISTRIBUTION AND DUTY CYCLE MODULATION OF A HIGH FREQUENCY DIGITAL SIGNAL

[76] Inventors: Eldon A. Byrd, 619 S., 400 E., Winchester, Ind. 47394; Alan J. Kacperski, 5457-A Millwood La., Willoughby, Ohio 44094

[21] Appl. No.: 08/887,303

[22] Filed: Jul. 2, 1997

Related U.S. Application Data

[60] Provisional application No. 60/027,918, Jul. 2, 1996.

[51] Int. Cl.[7] .................................... H03M 1/60
[52] U.S. Cl. .......................... 341/157; 341/166
[58] Field of Search .................... 341/155, 157, 341/166

[56] References Cited

U.S. PATENT DOCUMENTS

| | | | |
|---|---|---|---|
| 4,390,796 | 6/1983 | McClenahan et al. | 307/261 |
| 4,623,800 | 11/1986 | Price | 307/261 |
| 4,779,074 | 10/1988 | Whitford et al. | 341/166 |
| 4,901,078 | 2/1990 | Goyal | 341/163 |
| 5,574,456 | 11/1996 | Cho | 341/157 |

*Primary Examiner*—Marc S. Hoff

[57] ABSTRACT

A new method of presenting audio information is disclosed, wherein changes in amplitude and changes in frequency in two channels (stereo) has the additional parameter of phase information added to re-create the feeling of a live performance. Also, all three parameters are converted into duty cycle modulation of a high frequency digital pulse. Conventional loudspeakers and the brain decode the signal to provide audio signals that contain more information than simply frequency and amplitude changes as a function of time.

6 Claims, 11 Drawing Sheets

SYSTEM FOR CREATING AND AMPLIFYING THREE DIMENSIONAL SOUND EMPLOYING PHASE DISTRIBUTION AND DUTY CYCLE MODULATION OF A HIGH FREQUENCY DIGITAL SIGNAL

This application is a contintuation of Provisional App. No. 60/027,918 filed Jul. 2, 1996.

REFERENCES

On Minimum Audible Sound Fields, by Sivian and White. Presented to the Acoustical Soc. of Am. at Ann Arbor, Mich. Nov. 29, 1932.

Just Noticeable Differences in Dichotic Phase, by Zwislocki and Feldman, in J. Acous. Soc. of Am., Vol. 28, #5, September 1956.

"Auditory Frequency Selectivity", edited by Moore and Patterson, NATO ASI series A, Vol 119, 1986.

Regarding the Sound Quality of Violins and a Scientific Basis for Violin Construction, by H. Meinel, in, J. Acous. Soc. Am., Vol 29, #7, July 1957.

Acoustical Emissions in Humans and Animals, by P. M. Zurek, in, J. Acous. Soc. Am., 78(1), July 1985 (contains more than 50 additional references).

"Auditory Function: Neurobiological Bases of Hearing," edited by Edelman, Gall, and Cowan. Published by John Wiley and Sons, New York.

Ears Own Sounds May Underlie its Precision, by Malcolm W. Browne, in, The New York Times, Jun. 9, 1992.

Holographic Assessment of a Hypothesized Microwave Hearing Mechanism, by Alan Fry and Elaine Coran, in, Science Vol 206, Oct. 12, 1979.

Both Sides of the Mirror: Integrating Physics and Acoustics with Personal Experience, by Helen Hall, in, Leonardo Music Journal, vol 3, pp17–23, 1993.

Bioacoustics: A comparative approach, edited by Brian Lewis, Academic Press: 1983.

Determination of Loudspeaker Signal Arrival Times, Parts I, II, and III, in, J. of the Audio Engr. Soc., October, November, and December 1971, vol. 19, #'s 9,10, and 11.

Disclosure Document #344171, A Device for Converting Stereo into Phase Distributed Mono. Dec. 9, 1993.

Disclosure Document #374894, A Device for Converting Stereo into Phase Distributed Mono. Apr. 24, 1995.

International Patent Application No. PCT/US91/09375 filed Dec. 13, 1991, "Signal Processor for Recreating Original Audio Signals" (priority date: Dec. 14, 1990).

Operational Amplifiers with Linear Integrated Circuits, by Willian Stanley, Chas. Merrill: 1984, pp. 155–157.

U.S. Patent Documents

U.S. Pat. No. 4,545,065 October 1985 Visser, 381/41

U.S. Pat. No. 4,873,722 October 1989 Tominari

BACKGROUND OF THE INVENTION

1. Field of the Invention

Some audio processing systems make use of amplitude or frequency adjustment or both, others rely on optimizing the Group Delays of frequencies; however, the current invention described herein converts audio information (changes in amplitude and frequency) into a phase space, where changes in amplitude and frequency become phase shifts of portions of a digital pulse. Regular loudspeakers can automatically decode the phase information, resulting in a virtually distortion-free analog acoustic signal whose bandwidth is approximately 0–50 KHz and whose characteristics include not only changes in amplitude and frequency, but, also, changes in phase as a function of frequency. It is obvious from the scientific literature (see references) that no coherent theory of hearing currently exists. Low frequency acoustic signals' wavelengths are much too large to enter the ear canal, and high frequencies (above 6 KHz) cause bifrication of neuronal firing in the brain, allowing for subconscious processing of frequencies considered outside the normal (20-20 KHz) hearing range.

The current invention expands the bandwidth of the audio signal from the "normal" frequency range to about 0–50 KHz, separates frequencies as a function of time, and converts ordinary stereo signals into phase distributed monaural. The result is a signal that interacts with the human brain in a new way to produce an effect that resembles a live performance, restoring what was lost during the transduction and recording sequences. It was discovered in 1932 that hearing was not strictly physical, that psychological factors also contributed to our perception of sound (Sivian and White). That phase angles of even pure tones are sensed by humans was established in 1956 (Zwislocki and Feldman).

The ear is a non-linear device—current models and theories of hearing are based, primarily, on old, outdated linear models and concepts (Moore and Patterson). Some musical harmonics are non-linear (violin overtones, eg.) (Meinel). The interaction of acoustic signals from various musical instruments (including Human voices and electronic synthesizers) create interference patterns (Hall) that are embedded in the recording medium (tape, eg.), but whose characteristics are ignored with current transducers and recording and playback equipment. Just as laser processing of images focused on photographic emulsions can bring out the three-dimensional information in the two-dimensional image by retrieving phase information in the interference patterns, so this invention restores 3D information lost during transduction and recording. The result is a restoration of the "live" performance.

Classical theory indicates that acoustic events can be described in at least two ways; in a time domain or a frequency domain, each convertible into the other via a Fourier transformation. The mathematical formulation for this process is well known. The time-domain characterization of an acoustical event is a scalar, while the frequency-domain representation is a complex vector quantity containing amplitude and phase information. The time domain representation can also be expressed as a complex quantity. The scalar portion of the time domain vector represents performance based on impulse excitation; the imaginary part of the vector is the Hilbert transform of the scalar.

Loudspeakers and electrical networks which transfer energy from one form to another can be characterized by response to an impulse function, because the impulse response can be manipulated to predict the behavior of the system in response to any arbitrary signal. Fourier transforms work for predictive systems as well as causal systems. However, the group velocity of a set of audio signals is not related to time delay for all possible systems, and uniform group delay does not insure a distortionless system.

Group Delay is derived from phase delay, which is defined as the phase shift in a system at a given frequency. Group delay is associated with a group of frequencies around a central carrier, such as those encountered in modulated communications, but it also finds some relevance in describing how a system responds to a change in frequency. Group Delay follows an inverse square law. The value is fixed for DC but it approaches a finite value (near zero) at infinity. For a given function, and given the appropriate values for the resistor and capacitor, this logarithmic response will appear across the audio range. Starting with $T_{gd}=2\alpha_0/\alpha_0^2+\omega^2$, it can be shown that:

$$T_{gd}(\omega \approx \alpha_0) \approx 2.3/\alpha_0 \log (\alpha_0/\omega).$$

For a simple case it is possible to relate a logarithmic approximation to the group delay. The approximation was developed around a region where alpha equals omega. A more general equation for a larger region is presented below. It was derived using similar techniques but spans the area from omega equals alpha to omega "large" (50K radians or so). Small values of omega are not permissible, and the error at omega equals alpha is significant. These logarithmic equations are not specifically necessary for the design process but when the user works with practical circuits, it will be noted (on test equipment) that the Group Delay of the audio bandwidth changes logarithmically with frequency. The following equation can be used to validate the observations; however, it is noted that because of the foregoing, Group Delay is rather meaningless and phase shift more accurately describes the true action of the circuit. Group Delay is included here to provide an alternate way of analyzing the circuit's action.

These two equations are generally equivalent for $\omega>5\alpha_0$:

$$T_{gd}(\omega)=2\alpha_0/\alpha_0^2+\omega^2$$

$$T_{gd}(\omega)=2/\alpha_0 \cdot ln[1+(\alpha_0/\omega)^2].$$

The same equation rewritten for standard logarithms: $T_{gd}(\omega)\approx 4.6/\alpha_0 \cdot \log [1+(\alpha_0/\omega)^2]$ Interaural time difference, necessary for determining the position of a source, also has bearing on pitch. Further, most of the critical interaural time differences are in the range of plus or minus 1 millisecond. Thus, when the group delay is modified, so is the perception of the sound.

A generalized version of the All-pass response Group Delay is presented below. This equation can be used, with resonable accuracy, to predict the group delay of a specific frequency for various RC combinations. It also accounts for Gain adjustments. Using these equations, one can tailor the Group Delay response.

Referring to FIG. 5:
ti $\alpha_0=1/R_1C$ and $A=R_3/R_2$

The general transfer function is: $T(s)=-As-\alpha_0/s+\alpha_0$ which means the gain of the circuit is:

$$|T(s)|=-A.$$

The phase response is:

$$\phi(\omega)=-2 \tan^{-1} (\omega\sqrt{A}/\alpha_0)$$

and the Group Delay is given by:

$$T_{gd}(\omega)=(A+1)\alpha_0/\alpha_0^2+\omega^2 A+A\cdot 50 \text{ ns}+100 \text{ ns}$$

The second and third terms are included because their exclusion yields increasingly poor results with increasing frequencies. The above equations may be interpreted in the following physical sense: alpha determines the range over which the group delay responds logarithmically. An increase in alpha will tend to shift the range to higher frequencies, but will reduce the group delay itself, i.e., the actual delay times will decrease. A decrease in Gain, A, can be used to offset this decrease in delay. Conversely, for a given alpha, adjusting Gain can be used to set the delay time at the expense of the overall frequency range. Increasing Gain increases the maximum delay presented by the system (at very low omega), but the delay of a specific frequency compared to unity gain will be smaller due to the shift in frequency range; adjusting alpha can be used to compensate.

The circuits shown in FIGS. 3 & 5 all utilize an alpha of about 100 radians each. Increasing alpha will tend to emphasize lower frequencies, and decreasing alpha will tend to emphasize higher frequencies. In any case, a specifically desired response will require the adjustment of both Gain and alpha.

FIG. 3 shows the cascaded implementation. The effect of the cascade is a linear addition of the delays. The general effect of cascading is to delay a broader range of frequencies by a greater amount, thus enhancing the effect.

Because the time and frequency domains are two ways of describing the same event, accurate time domain representation cannot be obtained from limited frequency domain information. For example, the time delay of a frequency component passing through a system with nonuniform response cannot be determined with accuracy. However, a joint time-frequency characterization can be made using first and second order all-pass networks. This is consistent with ordinary human experience. At any frequency there are multiple arrivals of the audio signal at the listener's location as a function of time.

The individual time-frequency components of an audio signal, predicted mathematically, overlap in the time and frequency domains. Therefore, a graphical presentation is not possible, because it is impossible to separate simultaneous arrival times in a single time domain plot.

Potential energy (i.e., pressure expressed in dB) and comparisons of input to output signals directly (a measure of distortion) do not completely describe the performance of audio equipment quality such as loudspeakers, microphone, and electrical networks. Total sound energy provides phase distortion information and, although phase is not detectable consciously for simple signals, there are indications that the human hearing mechanism is capable of processing complex functions and perceiving phase information as part of total sound perception.

The square root of the total energy density vector, E, is equal to the sum of the square root of the potential energy vector and the imaginary component of the square root of the kinetic energy vector:

$$\sqrt{E} = \sqrt{P} + i\sqrt{K}$$

Attempts to measure the total energy density at a microphone responding to a remote sound source will only yield part of the total energy density of the source. Thus, at any given moment, a microphone will not directly measure E. Essentially, a microphone compresses complex spatial, multi-dimensional acoustic signals into a single point in time and space, effectively making the signal two-dimensional as a function of time. However, the information necessary to unravel the entire original signal is contained in the compressed signal and can be retrieved if processed properly.

Although the threshold of hearing has been established in terms of vector orientation and frequency of pure tones (see, e.g., L. Sivian and S. White, "on Minimum Audible Sound Fields," *J. Acoust. Soc. Am.,* Vol. 4, pp. 288–321 (1933)), pure tones have no Fourier transforms. The human hearing mechanism processes total energy density, not just the "minimum audible pressure" associated with a pure audio tone.

The ability to localize direction and distance from a sound source has something to do with the orientation of the ear with respect to the vector components of sound. For pure tones, simply the phase differences between arrival of the signal at the two ears provides a clue to the direction of the source. See Kinsler and Frey, *Fundamentals of Acoustics* (New York: John Wiley and Sons, 1950), pp. 370–392. Thus, the minimum audible field for binaural hearing varies with amplitude, frequency, and azimuth relative to the source signal.

J. Zwislocki and R. Feldman (1956) "Just Noticeable Differences in Dichotic Phase", *J. Acoust. Soc. Am.,* Vol. 28, No. 5, p. 860 (September 1956) pointed out that the ears may not be able to detect phase or time differences above 1300 Hertz and the only directional clues above 1300 Hz are contained in relative intensity differences at the ears.

In reality, the human auditory system binaurally localizes sounds in complex, spherical, three dimensional space using two sensors (ears) that are unlike microphones, a computer (brain) that is unlike any computer constructed by man, and, at a live performance, the eyes. The eyes allow us to "hear" direction by providing a sensory adjunct to the ears for localization of sound in azimuth, distance and height. During reconstruction of a familiar sound, such as a symphony orchestra, the brain remembers instrument placement and correlates this information with auditory clues to provide a more complete sense of the individual orchestra sections and sometimes of the locations of individual instruments. Techniques for localizing sound direction by the ears, neural pathways, and the brain have been termed "psychoacoustics".

In addition to direction, the brain will interpret distance as a function of intensity and time of arrival differences. These clues can be provided by reflected sound in a closed environment such as a concert hall, or by other means for sound originating in environments where no reflections occur, such as in a large open field. In a closed environment, there is a damping effect as a function of frequency due to reverberations. When acoustic energy is reflected from a surface, a portion of the energy is lost in the form of heat. Low frequencies tend to lose less energy and are transmitted more readily, whereas high frequencies tend to be absorbed more quickly. This makes the decay time of high frequencies shorter than that of low frequencies. The air itself absorbs all frequencies, with greater absorption occurring at high frequencies.

In "Biophysical Basis of Sound Communication" by A. Michelsen (in B. Lewis (ed.), *Bioacoustics, A Comparative Approach* (London: Academic Press, 1983)), at pages 21–22, the absorption of sound in air is described as a combination of dissapation due to heat and other factors not well understood. In air, the absorbtion coefficient in dB/100 meters is 1 at about 2 KHz. At about 9 KHz, the signal is down by 10 dB; at 20 KHz it is down by 100 dB; and at 100 KHz (the upper harmonics of a cymbal crash), it is down by about 1000 dB. Thus, higher harmonics generated by musical instruments are drastically attenuated (in a logarithmic fashion) by even a distance of a few feet when traveling to microphones, and then even more when traveling from speakers to the listener's ears.

With conventional stereophonic sound reproduction systems, it is necessary to be equidistant from the speakers in order to experience the proper stereo effect. With earphones, standard stereo provides a strange ping-pong effect coupled with an elevated "center stage" in the middle and slightly above the head. At best, ordinary stereo is an attempt to spread sound out for increased realism, but it is still basically two-dimensional.

In the 1920s Sir Oliver Lodge tested human hearing range out to 100 KHz. It has been suggested that the true range of human hearing is not completely known. However, the outer ear, inner ear (cochlea), auditory nerve, and human brain are capable of detecting, routing, and processing frequencies in excess of 100 KHz, and possibly to 300 KHz and beyond. However, conscious hearing is limited by the brain to roughly 20 Hz to 20 KHz.

There is no currently accepted theory of how humans actually hear outside the voice range of acoustic signals. Below about 200 Hz, the wavelength of an acoustic pressure wave is too large to enter the ear canal. Experience with low frequency standing waves suggests an interaction with the cochlea or auditory nerve directly. Indeed, standing wave acoustic emitters produce the perception of distortion-free sound throughout the hearing range. Above about 6 Hz, the "volley" theory and active cochlear processes could account for an increase in hearing range beyond 20 KHz. The volley theory is derived from the fact that there is not a single stimulus-response event per nerve; rather, higher frequency stimulation results in a multiplicity of neural firings. The process is one of bifurcation wherein the higher frequencies cause a greater number of neurons to fire. This suggests the possibility of fractal pattern generation. How the brain interprets the volley of information presented to it is unknown, however.

In *Auditory Function,* edited by G. Edleman, W. Gall, and W. Cowan, (New York: John Wiley & Sons, 1986), a class of experiments is described which demonstrate acoustic emissions from animal and human ears. The cochlea can function as a generator of acoustic signals which can combine with incoming signals to produce higher frequencies. Both empirical and theoretical studies (indicating that active cochlea processes are necessary for basilar membrane tuning properties) support the concept.

P. Zurek, in "Acoustic Emissions from the Ear—A Summary of Results from Humans and Animals", *J. Acoust. Soc. Am.,* Vol. 78, No. 1, pp. 340–344 (July 1985), indicates that frequency selectivity results from active cochlear processes. When the ear is presented with a non-linear pulse, in addition to the stimulus response mechanism, another response with an 8 millisecond (or longer) delay is produced. This phase-shifted signal, generated by the ear, may play a role in the actual way in which we hear music and other high frequency sounds. When musical instruments produce sound, the various Fourier waveforms are not simply produced independently of each other, but exist in a phase space wherein there are phase interactions among all of the sounds. Even a single string plucked on a harp or struck on a piano will produce phase-related signals and harmonics, not simply frequencies and amplitudes. Thus, the ear must be capable of decoding phase information in order to properly transduce complex sounds such as music.

The evoked time-delayed response in the ear is not simply a phase-shifted replica of the original sound, because the higher frequency components are time delayed less (about 8–10 milliseconds) than the lower frequency components of the emission (about 10–15 milliseconds). Also, the amplitude of the evoked response is non-linear with respect to the stimulus for high stimulus levels, amounting to about 1 dB for every 3 dB increase in the stimulus. The interaction of the stimulus and acoustic emission occurs increasingly with lower and lower levels of input, suggesting that the ear may have a compensation mechanism for low level signals. People with certain types of hearing loss do not product acoustic emissions. At low levels of auditory stimulus, the emissions are almost equal in amplitude to the incoming signal itself, and they occur even for pure tones. The ear can generate continuous signals, and generated signals as high as 8 KHz have been observed.

As noted earlier, the conscious hearing range is roughly between 20 Hz and 20 KHz. Audio equipment has been designed to be optimal within that range. Also, most equipment has been designed to accurately reproduce that which has been transduced and recorded. However, live sound is a transient phenomenon. It is not possible to compare a live sound with anything, because in order to do so, it must be transduced and recorded in some way. It is this fact that forms the motivation for the present invention, and discussion of the prior art that follows.

2. Description of Prior Art

There have been many attempts to unravel the compressed information in recorded sound to provide the information that was present in the live performance. Most of these attempts have colored the sound and failed because our understanding of how we hear has yet to be determined. However, progress has been made, and new theories have pointed the way toward a path that provides answers to previous questions concerning exactly how the human ear and brain interprets audio information.

Byrd in 1990 (PCT/US91/09375) described a circuit for adding phase information to audio signals in order to restore information that was lost during the transduction and recording process.

Tominari (1989) described a phase shift network that delayed low frequencies in time to provide an echo. Other attempts, although different than Tominari's, suffered from the same basic problem: how to restore the feeling of the live performance without causing some unwanted side effects. Even Byrd's design suffered from loss of a "center" such that vocals seemed to be in a tunnel, although instrumental music came alive with no side effects (there is no created center in most instrumental recordings).

Visser (1985) cites 35 U.S. and Foreign Patents that had attempted to create sound in various new ways. He considered his idea to be better than any of them, yet his addition of high-frequency broadband noise to audio signals and to transform the resultant to a binary coded pulse-width-modulation (while useful for some applications) is an unnecessary complication for purposes of creating a phase space out of an analog signal. The current invention overcomes all shortcomings of all the prior art and produces not only a re-creation of the live performance, but also provides a means for converting the processed signals into distortion-free digital duty-cycle-modulation and amplifying the result to virtually any desired power level at the most efficient and lowest cost possible.

Disclosure Document #344171 describes in block diagram form a circuit that was reduced to practice on Nov. 19, 1992. Units were loaned under-nondisclosure agreements for evaluation, and when it was apparent that significant advance in sound processing had occurred, Disclosure Document #374894 was filed on Apr. 24, 1995 detailing the circuits involved. The PWM chip that converts the output of the device from analog to digital and the amplifier circuit was added in July 1995. The circuits described herein represent a significant and unobvious improvement to the circuits described in PCT US91/09375.

Although prior art has attempted to correct some of the problems associated with distortion in audio systems due to phase shifts as a function of frequency, and spatial distortion due to the inherent inaccuracies in standard stereo, these attempts have not completely succeeded in restoring lost realism to recorded sound. At best, some prior art processors create the illusion of ambience.

The prior art provides single and, in some cases, multiple corrections to recorded signals. The object of the prior art is, in general, to control the location of sound cues and provide phase correction, to increase the quality of the sound by putting back in to the signal what was removed by the transduction, recording, and As previously pointed out, microphones compress signals that can consist of many fundamental frequencies from different instruments at different spatial locations. These signals also contain complex interactions for the fundamentals and harmonics produced by the same instruments. When cymbals crash, for example, the harmonics produced reach above 100,000 Hertz. As the complex signal develops from these interactions, it can become non-linear and sub-harmonics will be present.

At first, it would appear impossible to retrieve or reconstruct a complex signal whose spectral content has been compressed by microphones in both the time and spatial domains. The digital sampling rate of information that is recorded on compact discs and digital audio tapes, for example, results not only in a loss of information, but also in an absolute frequency cutoff that is lower than the upper harmonics produced by some musical instruments. The present invention arises from the recognition that, if the harmonics and subharmonics of recorded sound are allowed to develop from the fundamental frequencies, and if the spectral content of the signal is spatially separated, the original live sound can be recreated and converted into a digital signal that contains all necessary information for the ear and brain to interpret and recreate the original live sound.

SUMMARY OF THE INVENTION

The present invention overcomes the shortcomings of the prior art by causing harmonics and sub-harmonics to develop for all frequencies, by continuously correcting the phase of the signal logarithmically as a function of frequency, by spatially separating the spectral content of the signal, by increasing the audio bandwidth of the signal, and digitizing the result. The invention is based, in part, on the recognition that the human hearing mechanism for sensing audio signals (in contrast to electromagnetic and tactile signals) is different from the electronic circuits used to construct amplifiers, microphones, tape recorders, and other types of audio equipment. Thus, when humans hear or sense an audio signal, it is processed differently than standard apparatus attempting to transduce, record, and playback the original signals.

The present invention provides a new way to process and amplify sound in a way that converts amplitude, frequency, and phase information into duty cycle modulation of a high frequency digital pulse. The signal is integrated by the voice coil of ordinary loudspeakers and the phase information is interpreted by the brain so as to provide three dimensional sound. The acoustic hologram so produced is perceived to be like a live performance. Simple digital switching amplifiers can be added to yield any desired power level.

The invention has several objectives:

To create an expanded bandwidth for recorded (and live) sound in order to take advantage of harmonics outside the "normal" (20-20 KHz) hearing range, To create a phase shift of frequencies such that higher frequencies effectively reach the ear after lower frequencies (this creates the three dimensional characteristics of the sounds), To allow natural harmonics to be generated (this provides a sense of being closer to the source), To convert the amplitude, phase, and frequency information into duty cycle modulation of a high frequency digital pulses (>43 KHz) in order to encode the information in a way the ear and loudspeaker can precisely recreate the original information, And to amplify the result with a low distortion, simple, inexpensive amplifier that has no feedback.

The drawings and descriptions which follow elucidate the preferred embodiment and variations thereof.

In accordance with one aspect of the present invention, an audio signal processor comprises an input terminal for receiving an audio signal; first, second, and third processing stages for processing the audio signal, and an output terminal for coupling the processed audio signal to an output device. The first and second signal processing stages are arranged in a series or cascade configuration, and each stage functions to phase shift fundamental and harmonic frequencies as a function of frequency. The phase shift increases in a negative direction with increasing frequency, so that higher frequency signals lag the lower frequency signals. Also, the left and right channels are crossed over twice in order to homogenize the signal into phase distributed monaural. The output is then fed into a digital chip that converts the amplitude, frequency, and phase information into a form of duty cycle modulation.

The present invention can be implemented by means of a relatively simple electronic circuit that can be manufactured and sold at very low cost. The principal components of the circuit can, if desired, be reduced to a single dual inline package (DIP) which can be incorporated into existing types of audio equipment. The invention can be utilized with nearly all existing types of power amplifiers, stereo tuners, and phonographs with preamplifiers, as well as with compact disc (CD) players, digital audio tape (DAT) players, and conventional analog tape recorders and players. All recorded media can be reproduced with a sound that is very close to that of a live performance.

The invention can be used with any number of audio channels or speakers; the resulting sound will be dimensionalized, to some extent, with even a single speaker. The signal processing that is carried out by the present invention transfers to tape and to virtually any other type of recording medium. Thus, for example, a digital CD output can be processed using the present invention, and the result can be recorded on ordinary stereo audio tape. The present invention restores information that has been lost during digital or analog processing, as well as during the transduction of the original sound, and may be employed at a radio or television broadcasting station to improve the quality of the audio signal received by the listeners.

Further objectives, advantages and novel features of the invention will become apparent from the detailed description which follows.

BRIEF DESCRIPTIONS OF THE DRAWINGS

Figure 3:
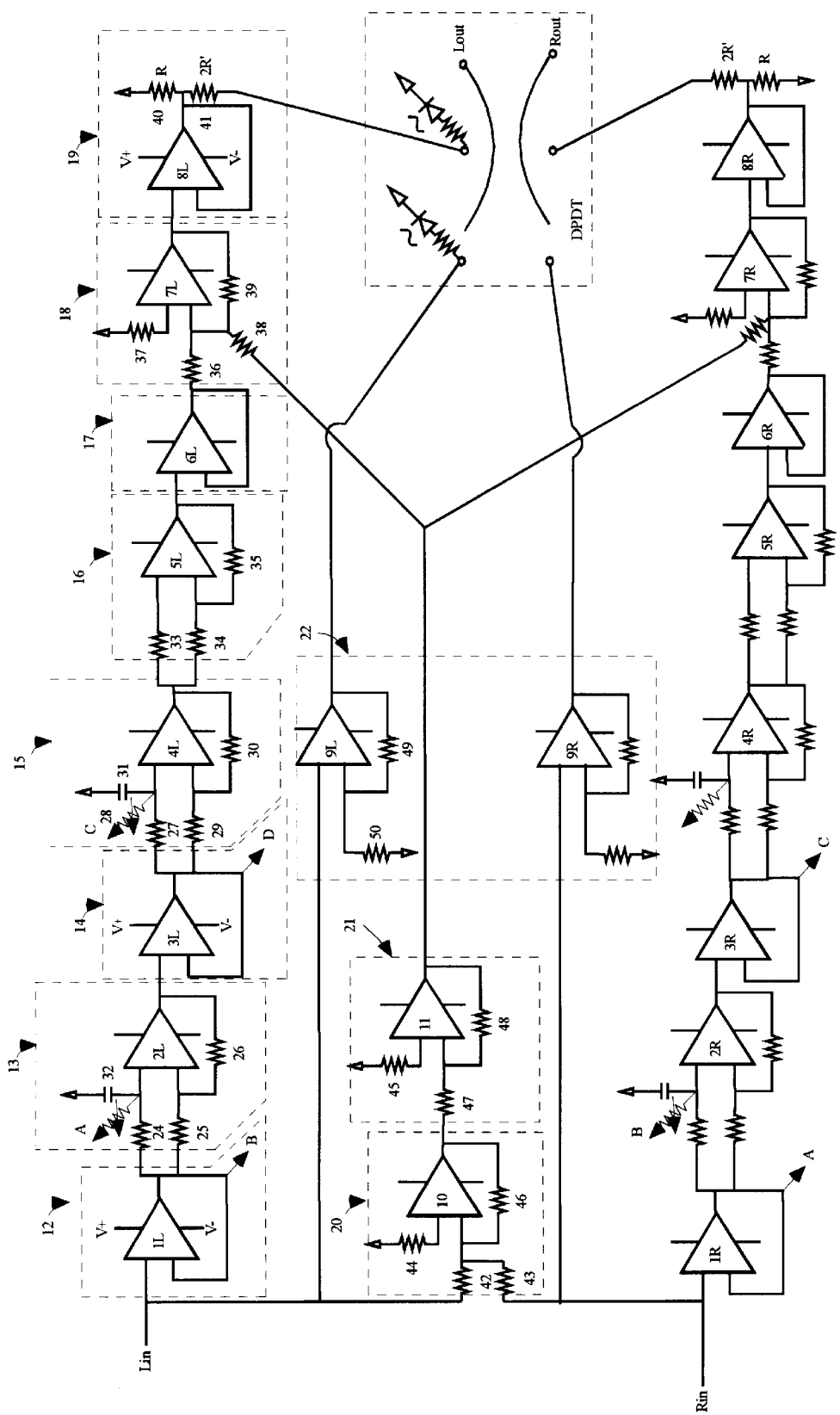
Figure 4:
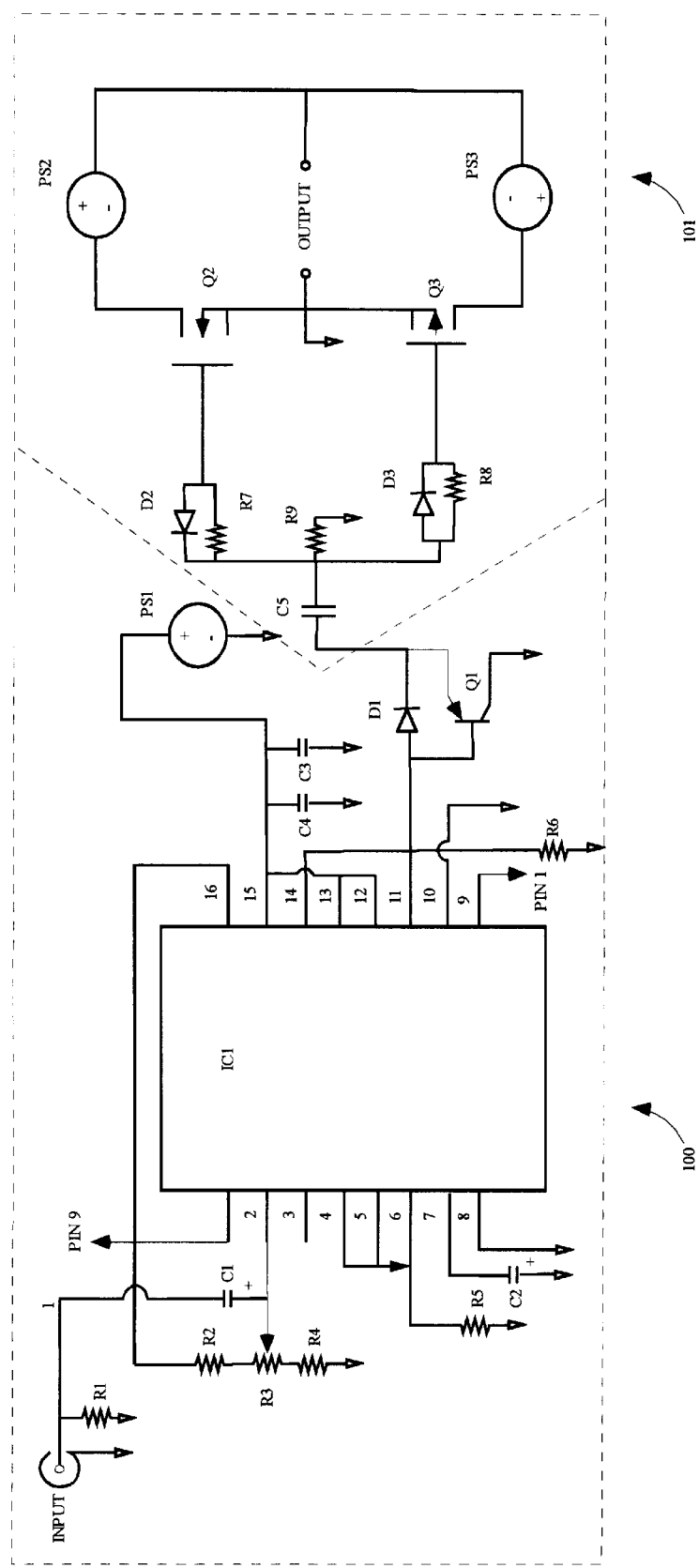
Figure 5B:
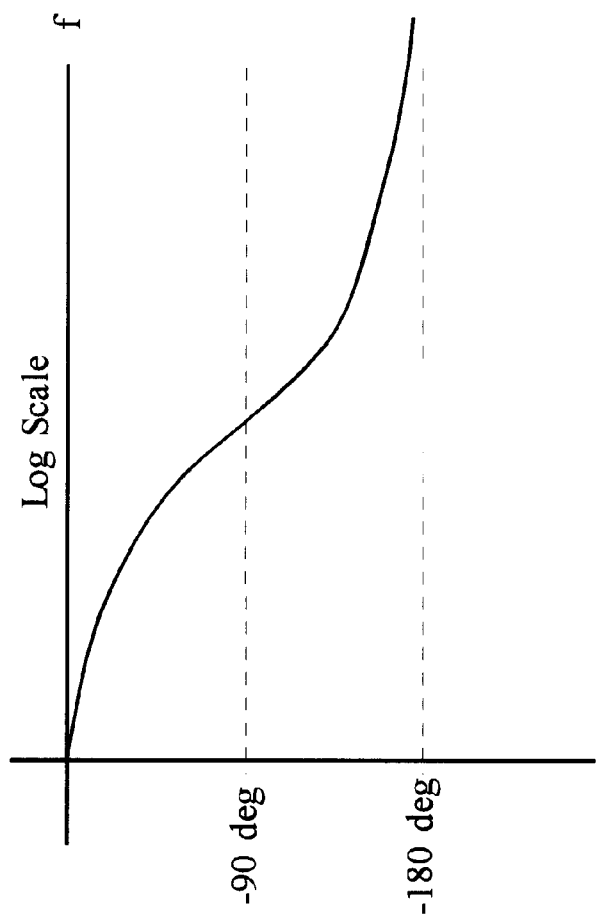
Figure 5A:
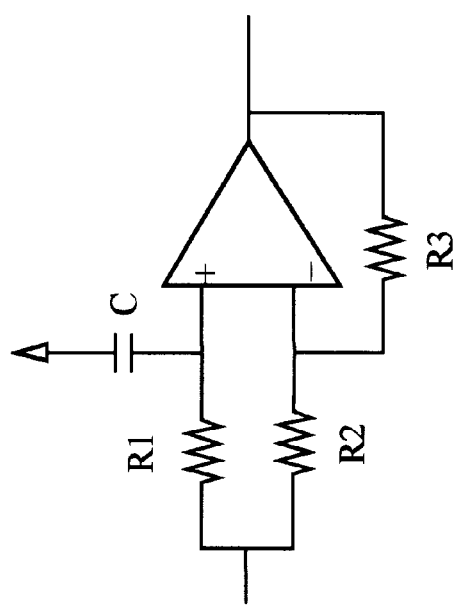
Figure 6B:
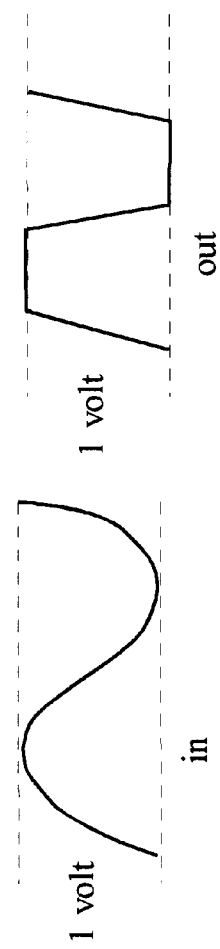
Figure 6A:
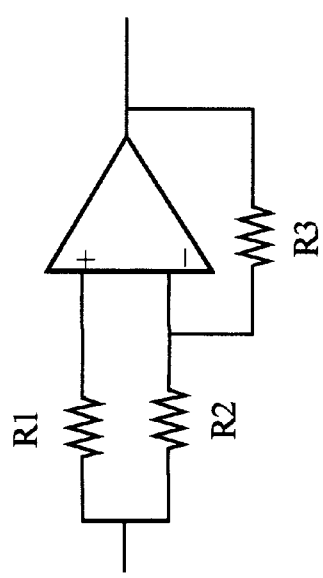
Figure 7:
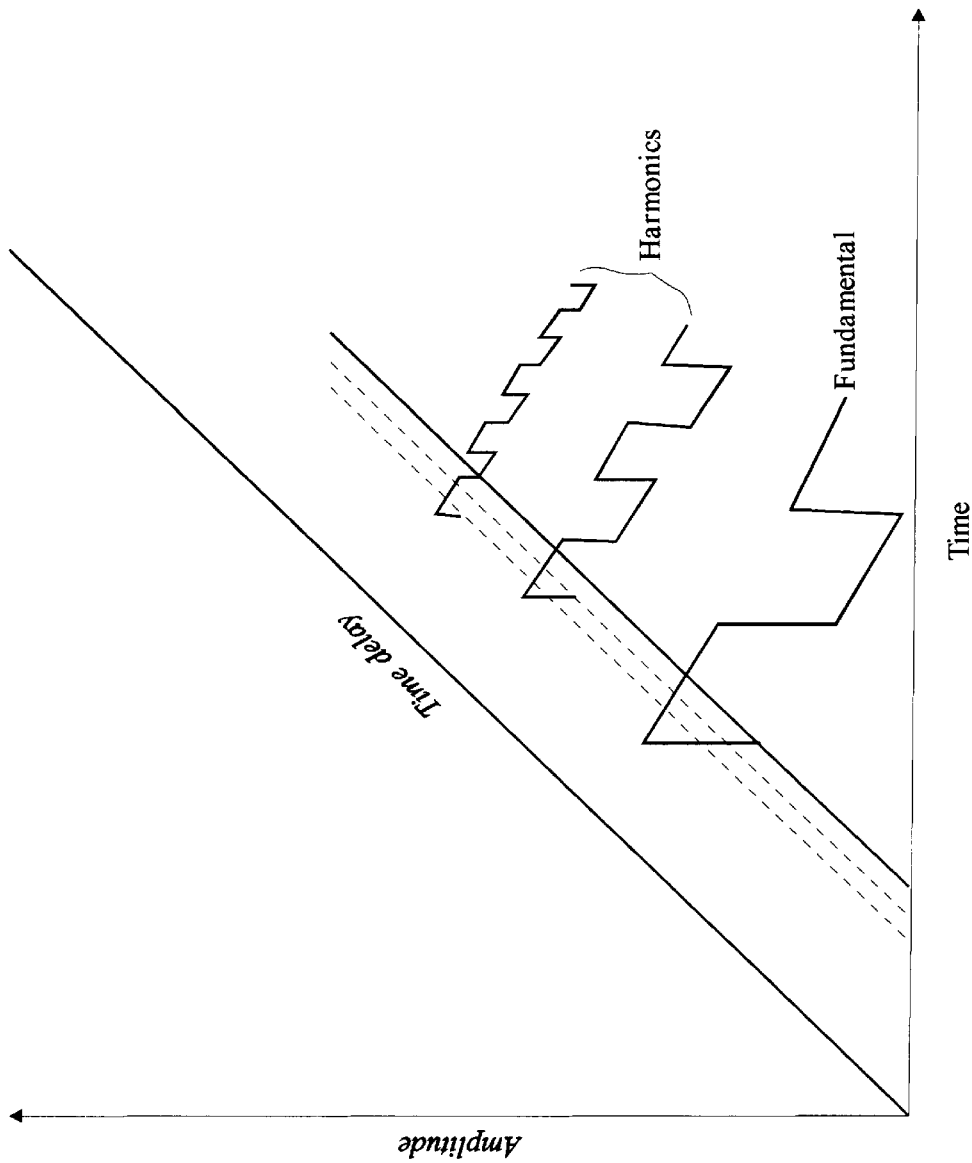
Figure 8A:
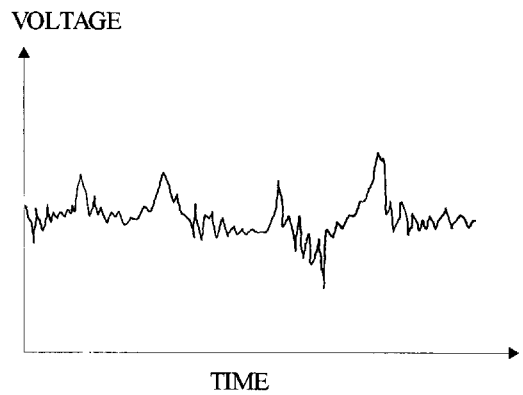
Figure 8B:
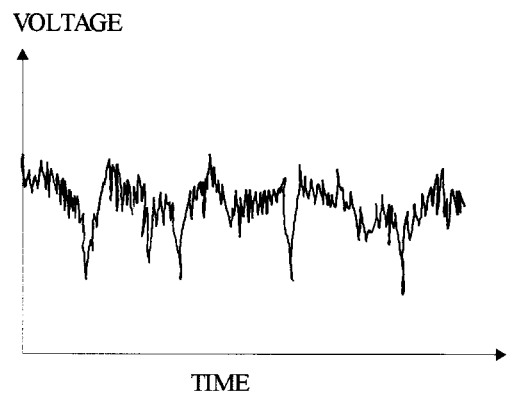
Figure 9A:
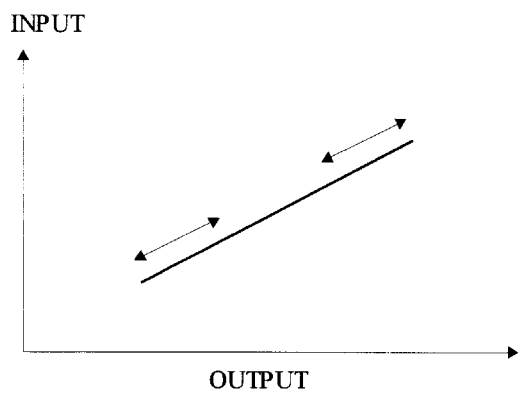
Figure 9B:
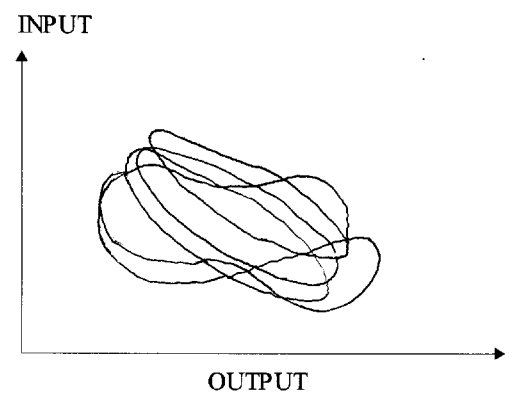
Figure 10A:
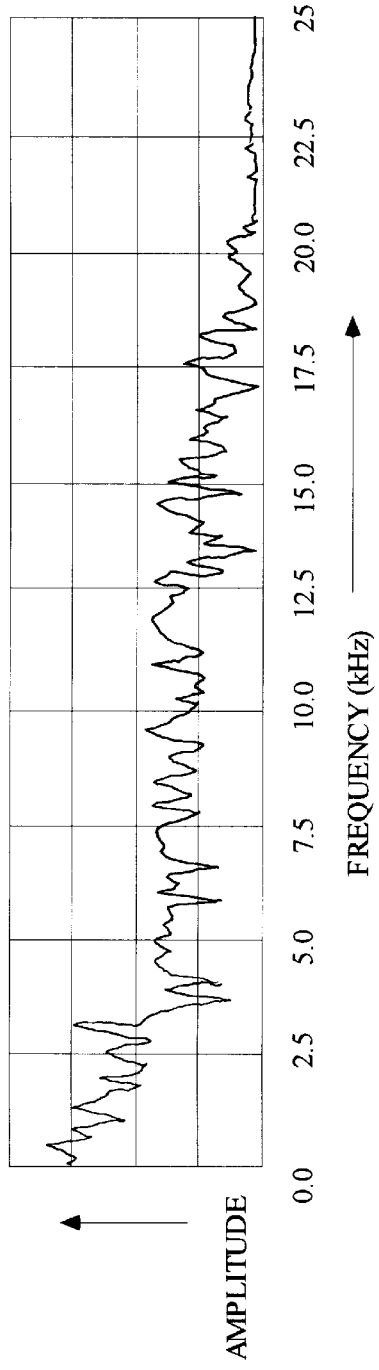
Figure 10B:
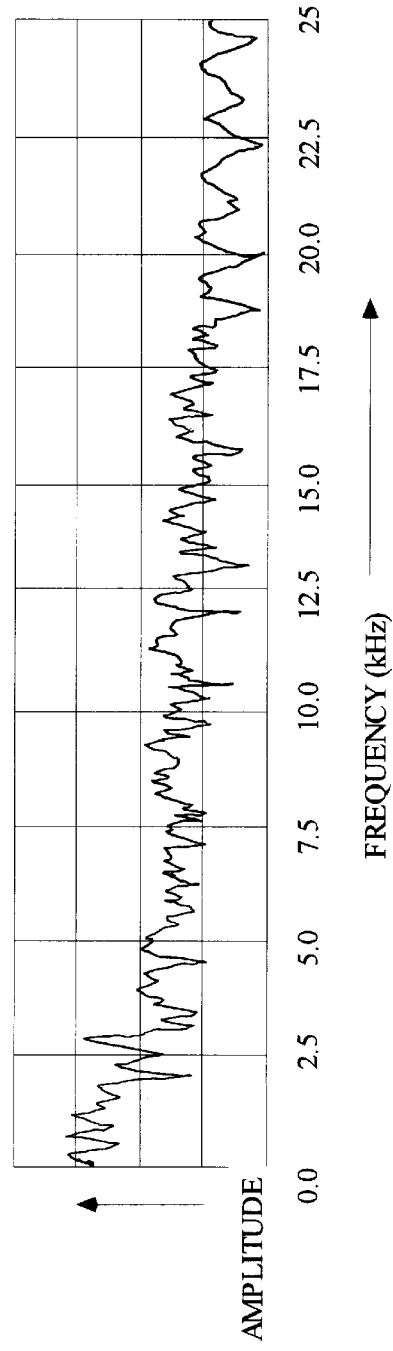
Figures 11A, 11B:
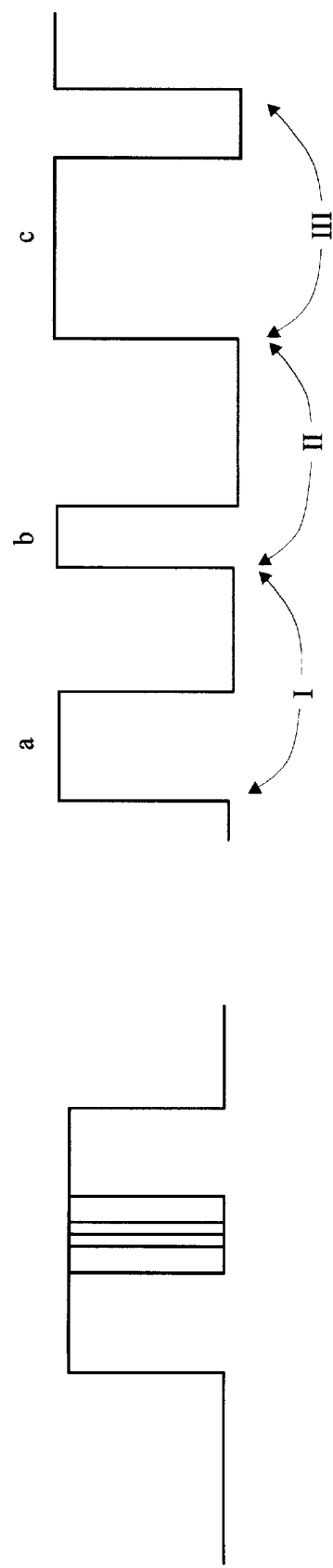
Figure 12:
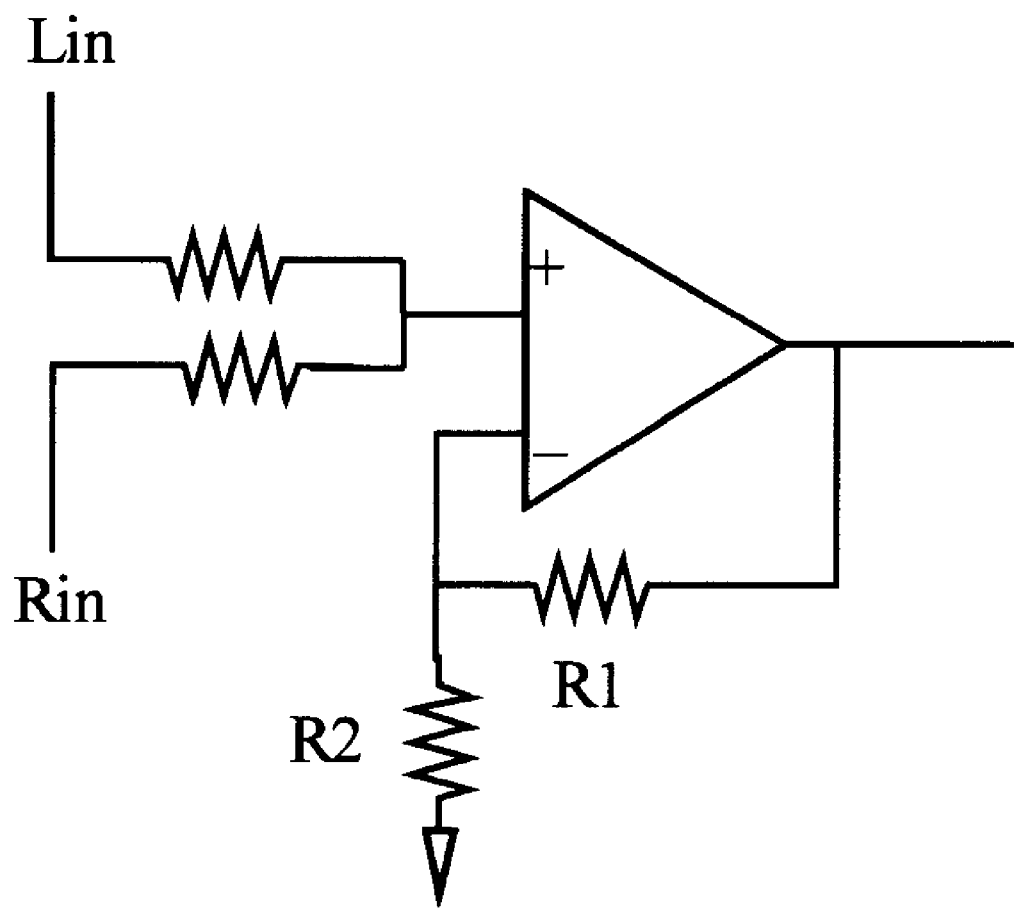

FIG. 3 displays the details of the processor portion of the system;

FIG. 4 shows the details of the analog-to-digital (A/D) converter and the digital amplifier parts of the system;

FIG. 5A is the phase shift network used in the processor;

FIG. 5B illustrates the phase shift characteristics of the network displayed in FIG. 5A;

FIG. 6A is the major high frequency harmonic producing network of the processor;

FIG. 6B illustrates how the network adds harmonics to the signals;

FIG. 7 illustrates how the processor separates harmonic frequencies in time as a function of frequency;

FIG. 8A shows actual oscilloscope trace of a single channel of a stereo recording;

FIG. 8B shows an actual oscilloscope trace for a single channel of stereo that has been processed with the processor in FIG. 3;

FIG. 9A shows an actual oscilloscope trace of the two stereo channels simultaneously input into an oscilloscope (the Right channel into the X input and the Left channel into the Y input);

FIG. 9B shows an actual oscilloscope trace for the signals processed by the circuit of FIG. 3 and as described above under FIG. 9A;

FIG. 10A illustrates the output of a Compact Disc as a function of time and frequency as taken from the screen of an audio spectrum analyzer;

FIG. 10B illustrates an actual trace from an audio spectrum analyzer for the same passage shown in FIG. 10A, but processed with the circuit shown in FIG. 3;

FIG. 11A shows the output of the A/D converter for amplitude and frequency and phase changes going in, frozen in time as a function of frequency;

FIG. 11B displays a typical duty-cycle-modulation as a time sequence (actual oscilloscope trace);

FIG. 12 shows an alternative embodiment for blocks number 20 and 21 in FIG. 3.

DETAILED DESCRIPTION

Figure 1:
FIG. 1 is a block diagram of the entire system for increasing the bandwidth of recorded and live signals, adding harmonics and phase information lost during the transduction and recording processes, and for converting the result to duty-cycle-modulation and amplification.

With reference to the drawings, FIG. 1 shows the overall system consisting of the analog processor and the A/D converter and Digital Amplifier. It is noted that the processor can function independently, as can the converter and the digital amplifier. Indeed, the processor is a line device that can accept outputs from pre-amps, tape decks, CD players, or any source that could be plugged into any standard power amplifier. Likewise, the A/D converter will accept line level inputs and can be used to digitize any line level analog input. The digital amplifier will accept any train of digital pulses and convert them to alternating current in order to drive transducer loads such as speakers, standing wave generators, tuned cavity resonators, hydrophones, etc.

Figure 2:
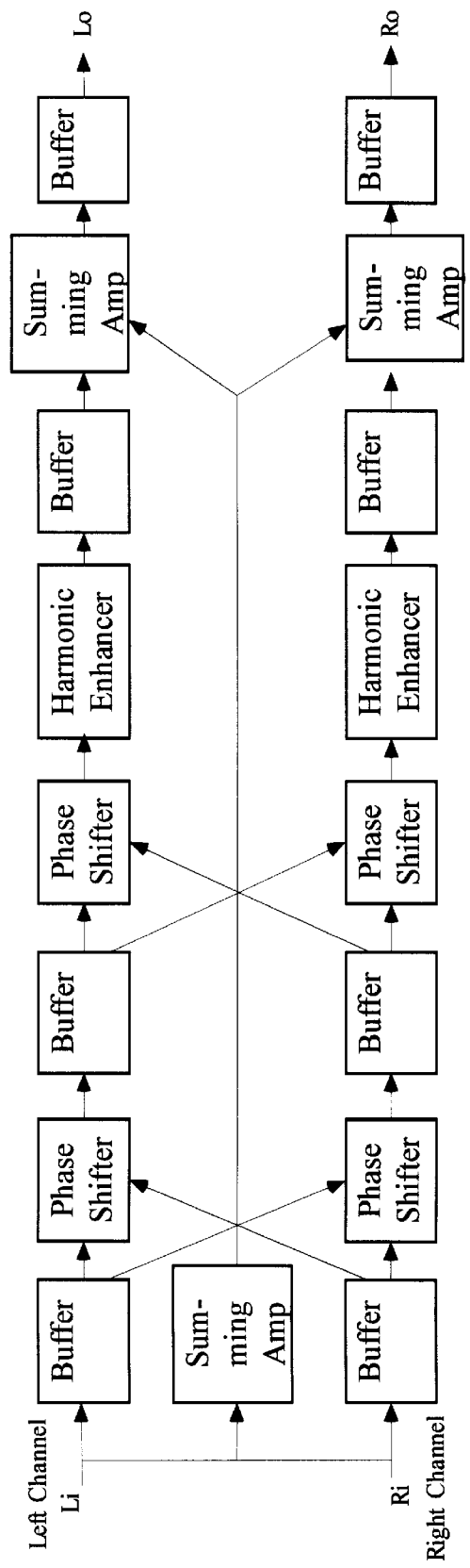
FIG. 2 is a block diagram of the signal flow of the processor part of the system showing cross-overs that homogenize the Right and Left stereo channels and produce phase distributed monaural.

FIG. 2 displays a block diagram of the analog processor by itself in order to show the overall signal flow through the circuit. The details of the processing is given in FIG. 3.

FIG. 3 displays Left and Right Channel inputs, with the Right Channel processing being identical to the Left Channel; therefor, only the Left Channel processing will be described. 12 is an input buffer. The operational amplifier can be of any variety compatible with the pin-out of a 741; however, higher slew rate devices (>12 v/μs) with J or Bi-FET inputs are more desirable. Even video op-amps can be used. The buffer op-amp can be provided with a wide range of supply voltages as specified by the manufacturer; however, in general, the higher the supply voltages, the more dynamic range available for the audio.

The output of the unity gain input buffer (which also acts to reduce repetitive noise) is fed into phase shifter 13 and to the non-inverting input of op-amp 2R. Phase shifter 13's non-inverting, inverting, and feedback resistors (24, 25, 26) along with capacitor 32 are selected to provide unity gain and a phase shift that delays higher frequencies more than lower frequencies. The all-pass filter formed by the circuit of 13 is described in more detail in FIG. 5. The Right Channel signal is crossed-over to the non-inverting input of op-amp 2L in 13. Note that this action does not cause a mixing of the signal by way of a simple addition as formed in mixer circuits; rather, the Right Channel signal is fed into the non-inverting input of the Left Channel phase shifter (13) along with the phase shifted Left Channel information. What exits op-amp 2L is a combination of Left Channel information, phase shifted left channel information, and (via the feedback resistor) a combination of these signals. The effect is to provide complex phase information that was present at the live performance, but compressed during the transduction and recording sequences. The output is fed into buffer 14, whose action is the same as buffer 12. The signal now goes into phase shifter 15 whose action is the same as phase shifter 13 with one important exception: the amount of phase shift is controlled by potentiometer 28. The signal now proceeds to the harmonic enhancer, 16. This circuit is discussed in detail in FIG. 6. After passing through unity gain buffer 17, whose function is the same as 12 and 14, the signal is summed in 18 with the sum of Left in and Right in. The sum of Left in and Right in is developed in 20 and 21. As shown, the two signals are summed in the inverting input to op-amp 10. All values of resistors, 42, 43, 44, and 46, are the same, in order to produce no gain. However, the output of 10 is inverted; therefor, it is run through inverting network 21. Resistors 45 and 47 are the same value; however, 48 is selected to provide 3 dB gain. The reason for this is to compensate for the 3 dB gain produced by the cross-overs in 13 and 15 (when 28 equals 10K ohms or higher). The output of 11 is summed with the processed Left Channel and the processed Right Channel in order to restore a "center" that is created on recordings where vocals are "panned to the center", but are canceled by the crossover process which can (at maximum) cause a 2 pi radian (360°) phase shift.

After the summation in 18, the signal goes through one more unity gain buffer stage (19) where either the signal is attenuated 3 dB to compensate for further increases in gain when 28 is near zero ohms, or R in 19 is eliminated and 2R is made zero ohms and 22 is used to boost the Right and Left Channels in Bypass mode by 3 dB for reasons stated above. If circuit 22 is employed then R in 19 is not required and 2R=0. DPDT switch 23 is used to switch between Process and Bypass. If the attenuation resistors in 19 are used, then Left in and Right in go directly to the switch as shown in 23. The switch can have an indicator.

FIG. 4 shows the A/D converter, 100, and the digital amplifier, 101. Referring to 100: the output of the processor in FIG. 3 goes into the input of 100. R1 sets the input impedance and provides a charge/discharge path for C1. C1 blocks direct current from pin 2 of IC1 from mixing with the input signal. IC1 is a regulating Pulse Width Modulator. However, as will be seen, in this case, the circuit will perform as a duty-cycle-modulator with a fixed carrier frequency. R2, R3, and R4 set the output duty cycle "Q" point, while R5 and C2 set the oscillation frequency. C3 and C4 filter the direct current input to IC1. R6 provides a current path for the base of Q1, a switching transistor, when it is "on". R6 also pulls down the output of IC1. D1 keeps Q1 "off" when the output of IC1 (pins 11 and 15) are "high". Q1 provides a fast discharge of C5 through R9 when the output of IC1 is in the high impedance (low logic) state. PS1 provides dc power to the chip, and it can be any voltage/current recommended by the manufacturer of IC1. Referring to 101: C5 couples the output of IC1 with its dc bias to the push-pull amplifier stage. It functions as an "anti-rectifier", blocking dc. R9 provides a charge/discharge path for C5. Field Effect Transistors Q2 and Q3 act as switches for positive and negative parts of the signal, shifting voltage, current and power to the requirements of the load.

D2 and R7 cause Q2 to turn on slightly slower than it turns off, so Q2 and Q3 will never be on at the same time. D3 and R8 do same thing for Q3. PS2 and PS3 provide the plus and minus load power for the output.

FIG. 4 circuits perform the functions of converting the input from FIG. 3 to a digital signal retaining all of the information in the analog signal. The instantaneous input amplitude values (which contain frequency and phase information) are sampled about 50,000 times/second and converted into a corresponding duty-cycle-modulation of the digital output. For zero volts amplitude in, the output duty cycle will be exactly 50% (adjusted so by R3 in 100). For any positive input value, the output duty cycle will be between 50% and 100%. For any negative input value the output duty cycle will be between zero and 50%. 100% is defined as positive and zero % is defined as negative. I.e., input amplitude changes are converted into output phase changes.

In order to drive significant loads (above 200 ma), the output of the converter must go through a power buffer consisting of power FET's and a dual power supply capable of driving the loads appropriately.

Referring to FIG. 5: The all pass circuit shown in 5A has the characteristics shown in 5B when R1 and C are "equal" (100K and 0.1 μf, eg.). R2 and R3 are equal so that no net gain is caused, 10K ohms, eg.

FIGS. 6A and 6B show the hormonic enhancer of 16 in FIG. 3. R1 is selected to be about 10 times more resistance than R2, and R3 is selected to about 75 to 100 times more than R2. The result is that any high frequency input signal to the enhancer network will develop harmonics without experiencing a gain increase. This is an unobvious circuit.

FIG. 7 displays how delayed high frequencies are actually separated in the time domain, allowing the brain time to synthesize the information into a three dimensional hologram.

FIG. 8A shows an actual oscilloscope tracing of a passage from a CD recording. FIG. 8B shows the same passage after traversing the processor described in FIG. 3. FIG. 9A shows a typical, processed output from a CD where the Right channel was placed into the X input of an oscilloscope, and the Left channel was input to the Y input. FIG. 9B shows the same passage Lissajous pattern after being processed by the circuitry of FIG. 3. Note that the signal now contains multi-dimensional phase information extracted from the two-dimensional stereo recording.

FIGS. 10A and 10B show before and after processing with the circuit of FIG. 3. Note that virtually no harmonics were present beyond 20 KHz before processing; whereas, harmonics are evident out to the limit of the spectrum analyzer used—25 KHz—after processing.

FIG. 11A shows the output of 100 in FIG. 4, frozen in frequency. This indicates that all the necessary information contained in the analog signal (amplitude, frequency, and phase) have been converted into equivalent phase shifts of a duty cycle modulated pulse whose nominal (at zero input) duty cycle is 50%. FIG. 11B shows the signal frozen in time. Note that the frequency (time between I, II, and III) is all the same; only the duty cycle has changed. The fall times of a, b, and c have changed, not the rise times.

FIG. 12 shows an alternative embodiment of the circuits in 20 and 21 in FIG. 3. If Left in and Right in are summed into the non-inverting input of the op-amp, then R1 and R2 can be selected to provide 3 dB gain, thereby combining 21 and 22 in FIG. 3.

What is claimed:

1. An analog to digital converter comprising:
   (a) a circuit for producing digital pulses with a constant amplitude and with a constant frequency of the leading edge exceeding 40 KHz and with the trailing edge of said pulses variable in time,
   (b) a circuit for encoding analog signal amplitude information into position of the trailing edge of said digital pulses and for encoding analog signal frequency information into rate of change of the trailing edge in time.

2. A digital amplifier comprising:
   (a) input terminals for coupling said amplifier with at least one channel of signal from said digitizer in claim 1,
   (b) output terminals for coupling at least one output signal from said amplifier to transducers,
   (c) a circuit for amplifying said digital pulses produced by the analog to digital converer in claim 1,
   (d) further, said amplifying circuit containing no feedback or filters.

3. A method for carrying out the digitization of one and two channel analog signals, said method comprising the steps of:
   (a) creating a digital pulse whose leading edge is a constant frequency greater than 40 KHz,
   (b) further, said digital pulse maintains a constant amplitude,
   (c) encoding changes in analog input amplitude into positions in time of the trailing edge of said digital pulses,
   (d) encoding changes in analog input frequencies into rates of change of the trailing edge of said digital pulses.

4. The method for carrying out the digitization of one and two channel analog signals according to claim 3, further including the step of:
   coupling said digital pulses to an amplifier,
   blocking any direct current in said digital pulses,
   causing any change the position of the trailing edge in time of said digital pulses to create a change in output power of said amplifier, said amplifier output delivering a higher output power than the input power into said amplifier,
   causing the rate of change of the trailing edge in time of said digital pulses to create a rate of change of the power delivered from said amplifier.

5. A system for creating and amplifying three-dimensional sound, comprising:
   a first channel signal processor comprising,
      a first channel input terminal for inputting a signal,
      a first unity gain stage buffer coupled to said first channel input terminal for receiving said input signal,
      a first signal processing stage coupled to said first unity gain stage buffer for processing said audio signal by generating harmonic frequencies related to fundamental frequencies in said signal and phase shifting said fundamental and harmonic frequencies as a function of frequency, said phase shift increasing in a negative direction with increasing frequency to cause higher frequency signals to lag lower frequency signals,
      a second unity gain stage buffer coupled to said first signal processing stage
      a first output terminal coupled to said second unity gain stage buffer for coupling the first channel signal to an output device,
   a second channel signal processor comprising,
      a second channel input terminal for inputting a signal,
      a third unity gain stage buffer coupled to said second channel input terminal for receiving said input signal,
      a second signal processing stage coupled to said third unity gain stage buffer for processing said audio signal by generating harmonic frequencies related to fundamental frequencies in said signal and phase shifting said fundamental and harmonic frequencies as a function of frequency, said phase shift increasing in a negative direction with increasing frequency to cause higher frequency signals to lag lower frequency signals,
      a fourth unity gain stage buffer coupled to said second signal processing stage
      a second output terminal coupled to said fourth unity gain stage buffer for coupling the processed second channel signal to an output device;
   an analog to digital converter coupled to said first and second output terminals, said analog to digital converter further comprising first circuit means for producing digital pulses having a constant amplitude and at a constant frequency with leading edge exceeding 40 KHz and with trailing edge being variable in time, and second circuit means for encoding analog signal amplitude information into rate of change of position as a function of time of the trailing edge of said digital pulses, and for encoding analog signal frequency information into position as a function of time of the trailing edge of said digital pulses.

6. The system for creating and amplifying three-dimensional sound according to claim 5, further comprising a digital amplifier coupled to said analog to digital converter for amplifying said digital pulses produced by the analog to digital converter, said digital amplifier being exclusive of feedback and filters.

* * * * *